United States Patent
Mouri

(10) Patent No.: US 7,382,619 B2
(45) Date of Patent: Jun. 3, 2008

(54) PRINTED CIRCUIT BOARD WITH IMPROVED HEAT DISSIPATION EFFICIENCY, ELECTRONIC APPARATUS HAVING PRINTED CIRCUIT BOARD WITH IMPROVED HEAT DISSIPATION EFFICIENCY, CRT DISPLAY DEVICE HAVING PRINTED CIRCUIT BOARD WITH IMPROVED HEAT DISSIPATION EFFICIENCY, AND RECORDING/REPRODUCING DEVICE OR VIDEO DISPLAY DEVICE INCORPORATING RECORDING/REPRODUCING DEVICE HAVING PRINTED CIRCUIT BOARD WITH IMPROVED HEAT DISSIPATION EFFICIENCY

(75) Inventor: Yoshitaka Mouri, Takefu (JP)

(73) Assignee: Orion Electric Co., Ltd., Fukui (JP)

( * ) Notice: Subject to any disclaimer, the term of this patent is extended or adjusted under 35 U.S.C. 154(b) by 315 days.

(21) Appl. No.: 11/127,238

(22) Filed: May 12, 2005

(65) Prior Publication Data

US 2005/0254218 A1 Nov. 17, 2005

(30) Foreign Application Priority Data

May 14, 2004 (JP) .............................. 2004-144587

(51) Int. Cl.
*H05K 7/20* (2006.01)

(52) U.S. Cl. ...................... 361/719; 361/690; 174/16.1; 165/80.3

(58) Field of Classification Search ...................... None
See application file for complete search history.

(56) References Cited

U.S. PATENT DOCUMENTS

| | | | | |
|---|---|---|---|---|
| 4,027,206 A | * | 5/1977 | Lee ............................ | 361/697 |
| 5,053,881 A | | 10/1991 | Campisi | |
| 5,294,374 A | * | 3/1994 | Martinez et al. ............ | 252/516 |
| 5,390,078 A | * | 2/1995 | Taylor ........................ | 361/721 |
| 5,424,915 A | * | 6/1995 | Katooka et al. ............ | 361/695 |

(Continued)

FOREIGN PATENT DOCUMENTS

DE 3631963 A1 3/1988

(Continued)

OTHER PUBLICATIONS

Search Report issued in corresponding European Application No. 05252968.2—1235 dated Nov. 15, 2007.

*Primary Examiner*—Boris Chervinsky
(74) *Attorney, Agent, or Firm*—Westerman, Hattori, Daniels & Adrian, LLP.

(57) ABSTRACT

The invention provides an electric apparatus having a printed circuit board with an improved heat dissipation capacity, and, in particular, to provide an electric apparatus requiring plural printed circuit boards that has an improved heat dissipation efficiency and can be produced at a low cost.

A main printed circuit board 10 and a sub board 17 are composite-molded, and the sub board 17 is formed at an area close to or immediately below a heat-generating electronic component 23 or a heat dissipation plate 23a. Thus, by separating the sub board 17 off the main printed circuit board 10, a hole serving as a ventilating hole is formed in the main printed circuit board 10 at the area close to or immediately below the heat-generating electronic component 23 or the heat dissipation plate 23a.

3 Claims, 10 Drawing Sheets

U.S. PATENT DOCUMENTS

| | | | | |
|---|---|---|---|---|
| 5,694,294 | A | * 12/1997 | Ohashi et al. | 361/687 |
| 5,734,555 | A | * 3/1998 | McMahon | 361/704 |
| 5,742,477 | A | * 4/1998 | Baba | 361/704 |
| 5,835,781 | A | * 11/1998 | Van de Steeg et al. | 712/1 |
| 6,075,700 | A | * 6/2000 | Houghton et al. | 361/704 |
| 6,501,662 | B2 | * 12/2002 | Ikeda | 361/760 |
| 6,519,149 | B1 | 2/2003 | Inoue | |
| 6,652,805 | B2 | * 11/2003 | Holl et al. | 419/10 |
| 6,816,378 | B1 | * 11/2004 | Belady et al. | 361/704 |
| 6,908,960 | B2 | * 6/2005 | Takaya et al. | 524/494 |

FOREIGN PATENT DOCUMENTS

| | | | |
|---|---|---|---|
| GB | 2160366 | * | 12/1985 |
| JP | 1-313993 | A | 12/1989 |
| JP | 5-55590 | | 7/1993 |
| JP | 11-238986 | A | 8/1999 |
| JP | 2002-93928 | | 3/2002 |
| JP | 2003-157669 | A | 5/2003 |

* cited by examiner

PRINTED CIRCUIT BOARD WITH IMPROVED HEAT DISSIPATION EFFICIENCY, ELECTRONIC APPARATUS HAVING PRINTED CIRCUIT BOARD WITH IMPROVED HEAT DISSIPATION EFFICIENCY, CRT DISPLAY DEVICE HAVING PRINTED CIRCUIT BOARD WITH IMPROVED HEAT DISSIPATION EFFICIENCY, AND RECORDING/REPRODUCING DEVICE OR VIDEO DISPLAY DEVICE INCORPORATING RECORDING/REPRODUCING DEVICE HAVING PRINTED CIRCUIT BOARD WITH IMPROVED HEAT DISSIPATION EFFICIENCY

The present application is based on and claims priority of Japanese patent application No. 2004-144587 filed on May 14, 2004, the entire contents of which are hereby incorporated by reference.

BACKGROUND OF THE INVENTION

1. Field of the Invention

The present invention relates to a printed circuit board with an improved heat dissipation efficiency. In particular, the present invention relates to a printed circuit board with an improved heat dissipation efficiency that has a ventilating hole for heat dissipation formed by separating a composite-molded board off the main printed circuit board.

2. Description of the Related Art

Printed circuit boards of electronic or electric apparatus, such as a television set and a video recording/reproducing device (a DVD recorder, for example), have various types of electronic components, electronic devices and the like mounted thereon. Many of these electronic components and the like generate considerable amounts of heat. In addition, many of them cannot operate stably at higher temperatures. Thus, the heat generated in the electronic apparatus has to be dissipated successfully. With the recent trends toward higher packaging densities for smaller or thinner products and toward higher powers for higher performance, such a thermal problem has become more important.

According to a conventional solution to such a problem, a ventilating hole is formed in the housing of the electric apparatus to release the heat generated in the apparatus to the outside. Furthermore, a ventilating hole is formed also in the printed circuit board in the apparatus to form air paths from the outside to the inside and vice versa, thereby enhancing the heat dissipation efficiency.

Prior art techniques concerning the printed circuit board with a ventilating hole for heat dissipation described above are disclosed in Japanese Utility Model Laid-Open Publication No. 5-55590 (Patent Document 1) and Japanese Patent Laid-Open Publication No. 2002-93928 (Patent Document 2).

According to some prior art techniques, successive cuts are formed in the printed circuit board, and a portion of the printed circuit board is separated off to form a hole in the board, thereby facilitating heat dissipation of an electronic component on the board. According to the prior art technique disclosed in Patent Document 1, such a heat-dissipating hole is formed by press working, thereby saving the cost of forming such a board portion to be separated off (a sacrificial board) and eliminating the need for the separation step. However, the prior art technique disclosed in Patent Document 1 requires an additional press die and an additional press working step.

On the other hand, the electric apparatus often requires a plurality of boards, such as "a main board responsible for the processing of the whole apparatus and a sub board responsible for a specific processing". Therefore, conventionally, in order to improve the board efficiency and enable processing of a plurality of boards in one step, composite molding is conducted (to be specific, the main board and the sub board are formed as a dividable one board, treated as one board when conducting a processing common to the boards, and then separated from each other for use as the separate boards).

SUMMARY OF THE INVENTION

In view of the circumstances described above, an object of the present invention is to provide an electric apparatus having a printed circuit with an improved heat dissipation efficiency at a low cost.

A printed circuit board with an improved heat dissipation efficiency according to an aspect 1 of the present invention is a printed circuit board on which a heat-generating electronic component or device is mounted, characterized in that a composite-molded board, which is to be separated off the printed circuit board for use, is formed in the printed circuit board at an area close to or immediately below the heat-generating electric component or device mounted on the printed circuit board.

According to this aspect, the composite-molded board is separated off the printed circuit board, thereby forming a hole in the printed circuit board at an area close to or immediately below the heat-generating electronic component or device mounted on the printed circuit board.

An electric apparatus having a printed circuit board with an improved heat dissipation efficiency according to an aspect 2 of the present invention is characterized in that the printed circuit board is the printed circuit board with an improved heat dissipation efficiency according to the aspect 1.

According to this aspect, since the printed circuit board disposed in the electric apparatus has a hole, a ventilating path is provided in the electric apparatus.

A CRT display device having a printed circuit board with an improved heat dissipation efficiency according to an aspect 3 of the present invention is characterized in that the printed circuit board is the printed circuit board with an improved heat dissipation efficiency according to the aspect 1, and the composite-molded board is a CRT board.

According to this aspect, by separating the CRT board, which is a composite-molded board, off the printed circuit board in the CRT display device, a hole serving as a ventilating hole is formed in the printed circuit board.

A recording/reproducing device or a video display device incorporating a recording/reproducing device having a printed circuit board with an improved heat dissipation efficiency according to an aspect 4 of the present invention, in which a heat-generating electronic component and a recording/reproducing unit are mounted on the printed circuit board, or the printed circuit board on which a heat-generating electronic component is mounted and a recording/reproducing unit are disposed close to each other, is characterized in that a ventilating hole is formed in the printed circuit board in such a manner that a part or the whole of the hole lies within a projected area of the recording/reproducing unit onto the printed circuit board and is located close to the heat-generating electronic component.

According to this aspect, a ventilating hole is formed in the printed circuit board at the area immediately below the recording/reproducing unit, which is a heat-generating electronic device, (that is, the projected area of the recording/reproducing unit onto the printed circuit board) and close to the heat-generating component in the recording/reproducing device or the video display device incorporating a recording/reproducing device.

The recording/reproducing device or a video display device incorporating a recording/reproducing device having a printed circuit board with an improved heat dissipation efficiency according to an aspect 5 of the present invention is the recording/reproducing device or a video display device incorporating a recording/reproducing device having a printed circuit board with an improved heat dissipation efficiency according to the aspect 4, characterized in that, instead of the ventilating hole, a composite-molded board is formed in the printed circuit board at the same site as the ventilating hole.

According to this aspect, by separating the composite-molded board off the printed circuit board, a hole serving as a ventilating hole is formed in the printed circuit board at the area immediately below the recording/reproducing unit (that is, the projected area of the recording/reproducing unit onto the printed circuit board) and close to the heat-generating component.

The video display device incorporating a recording/reproducing device having a printed circuit board with an improved heat dissipation efficiency according to an aspect 6 of the present invention is the video display device incorporating a recording/reproducing device having a printed circuit board with an improved heat dissipation efficiency according to the aspect 5, characterized in that the composite-molded board is a CRT board, and the recording/reproducing unit is a disk device that reads and/or writes a signal from/to an optical disk medium.

According to the aspect 1 of the present invention, there is provided a printed circuit board with an improved heat dissipation efficiency, on which a heat-generating electronic component or device is mounted, characterized in that a composite-molded board, which is to be separated off the printed circuit board for use, is formed in the printed circuit board at an area close to or immediately below the heat-generating electric component or device mounted on the printed circuit board. In this case, since the boards are composite-molded, the production cost is reduced. And since the composite-molded board is formed close to or immediately below the heat-generating electronic component or device mounted on the printed circuit board, a hole serving as a ventilating hole is formed in the printed circuit board by separating the composite-molded board off the printed circuit board, and thus, the heat dissipation efficiency of the heat-generating electronic component or device can be improved. In addition, since separation of the composite-molded board off the printed circuit board and formation of the ventilating hole for heat dissipation in the printed circuit board are performed in one step, and thus, any additional device or step is not required to form the ventilating hole in the printed circuit board, the work efficiency can also improved. Furthermore, the hole resulting from removal of the composite-molded board is relatively large, and therefore, a high heat dissipation efficiency can be achieved.

According to the aspect 2 of the present invention, there is provided an electric apparatus having a printed circuit board with an improved heat dissipation efficiency, characterized in that the printed circuit board is the printed circuit board with an improved heat dissipation efficiency according to the aspect 1. In this case, since the ventilating hole in the printed circuit board provides a ventilating path in the electric apparatus, convection of air is facilitated in the vicinity of the heat-generating electronic component or device in the electric apparatus, and heat transfer and dissipation of the heat-generating electronic component or device can be achieved efficiently. Thus, the component or device in the electric apparatus can be prevented from being overheated.

According to the aspect 3 of the present invention, there is provided a CRT display device having a printed circuit board with an improved heat dissipation efficiency, characterized in that the printed circuit board is the printed circuit board with an improved heat dissipation efficiency according to the aspect 1, and the composite-molded board is a CRT board. In this case, since the CRT board, which is necessary in addition to the printed circuit board (the main circuit board), is composite-molded along with the main printed circuit board, the board efficiency is improved, and the production cost is reduced. In addition, since the CRT board is formed at the area close to or immediately below the heat-generating electronic component or device mounted on the main printed circuit board, a hole serving as a ventilating hole is formed in the main printed circuit board at the area close to the heat-generating electronic component or device by separating the CRT board off the printed circuit board. Thus, the CRT display device with an improved heat dissipation efficiency can be produced at a low cost.

According to the aspect 4 of the present invention, there is provided a recording/reproducing device or a video display device incorporating a recording/reproducing device having a printed circuit board with an improved heat dissipation efficiency, in which a heat-generating electronic component and a recording/reproducing unit are mounted on the printed circuit board, or the printed circuit board on which a heat-generating electronic component is mounted and a recording/reproducing unit are disposed close to each other, characterized in that a ventilating hole is formed in the printed circuit board in such a manner that a part or the whole of the hole lies within a projected area of the recording/reproducing unit onto the printed circuit board and is located close to the heat-generating electronic component. In this case, a ventilating path is formed particularly in the area immediately below the recording/reproducing unit (the projected area of the recording/reproducing unit onto the printed circuit board) which tends to retain heat and close to the heat-generating electronic component, and therefore, convection of air is facilitated in that area. Thus, the component or device is prevented from being overheated.

According to the aspect 5 of the present invention, the recording/reproducing device or the video display device incorporating a recording/reproducing device having the printed circuit board with an improved heat dissipation efficiency according to the aspect 4 is characterized in that, instead of the ventilating hole, a composite-molded board is formed in the printed circuit board at the same site as the ventilating hole. In this case, since the hole serving as the ventilating hole is formed at the area close to the recording/reproducing unit and the heat-generating electronic component by separating the composite-molded board off the printed circuit board, the recording/reproducing device or the video display device incorporating a recording/reproducing device with an improved heat dissipation efficiency can be produced at a low cost.

According to the aspect 6 of the present invention, the video display device incorporating a recording/reproducing device having a printed circuit board with an improved heat dissipation efficiency according to the aspect 5 is characterized in that the composite-molded board is a CRT board, and the recording/reproducing unit is a disk device that reads and/or writes a signal from/to an optical disk medium. In this case, a hole serving as a ventilating hole can be formed particularly close to the disk device, which tends to retain heat, and the heat-generating electronic component by separating the CRT board off the printed circuit board. Thus, the video display device incorporating a recording/reproducing device with an improved heat dissipation efficiency can be produced at a low cost. In addition, since the heat dissipation efficiency of the disk device and the heat-generating electronic component is high, the packaging density of components of the video display device incorporating a recording/reproducing device can be raised. As a result, secondary advantages are provided. For example, the device can be down-sized, or the design flexibility of the device is enhanced.

DETAILED DESCRIPTION OF THE PREFERRED EMBODIMENTS

In the following, specific embodiments of the present invention will be described with reference to the drawings. However, the embodiments described below are shown only for illustrating the present invention and are not intended for limitation of the present invention.

Embodiment 1

Figure 1:
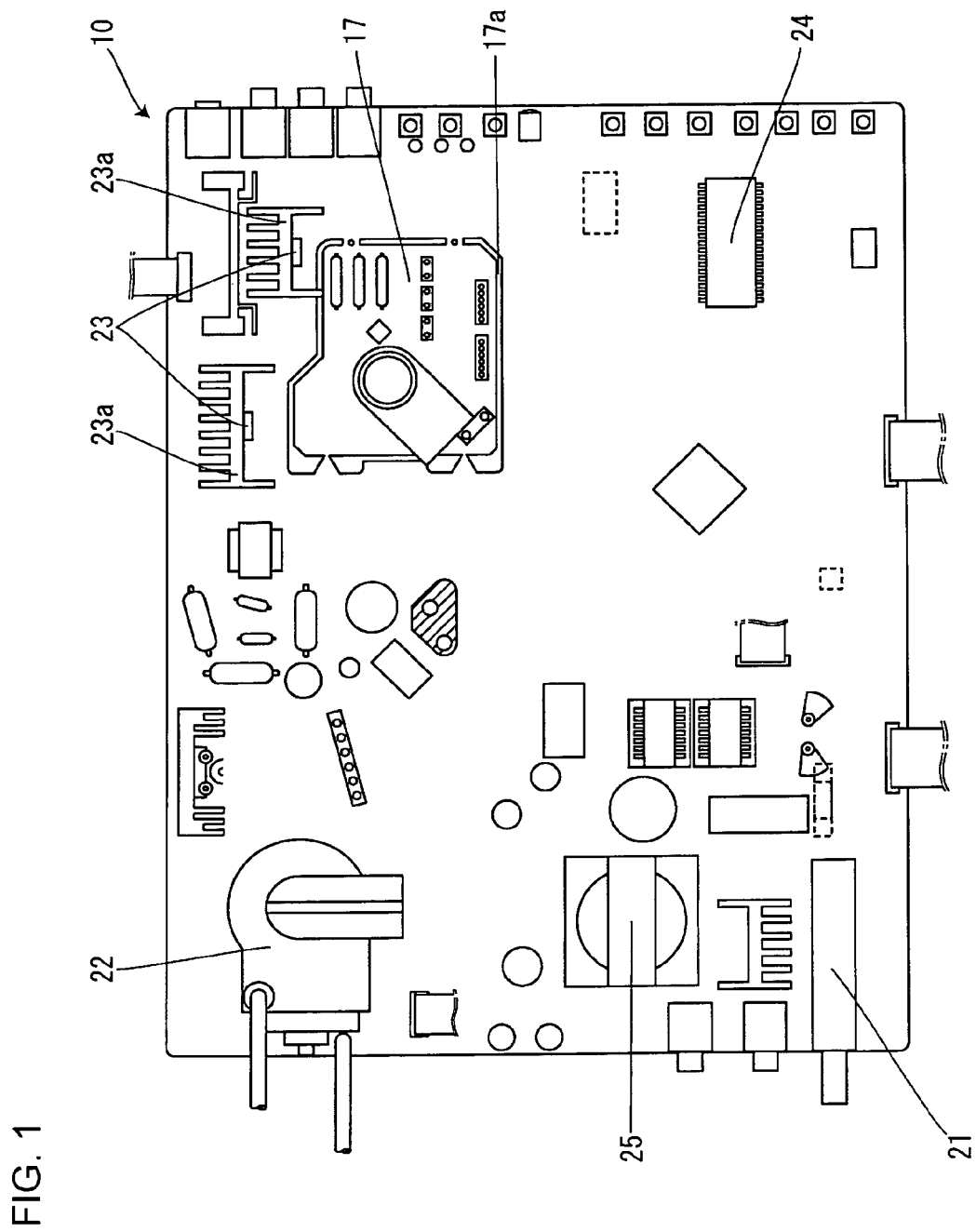
FIG. 1 is a plan view of a printed circuit board with an improved heat dissipation efficiency according to an embodiment 1.
Figure 2:
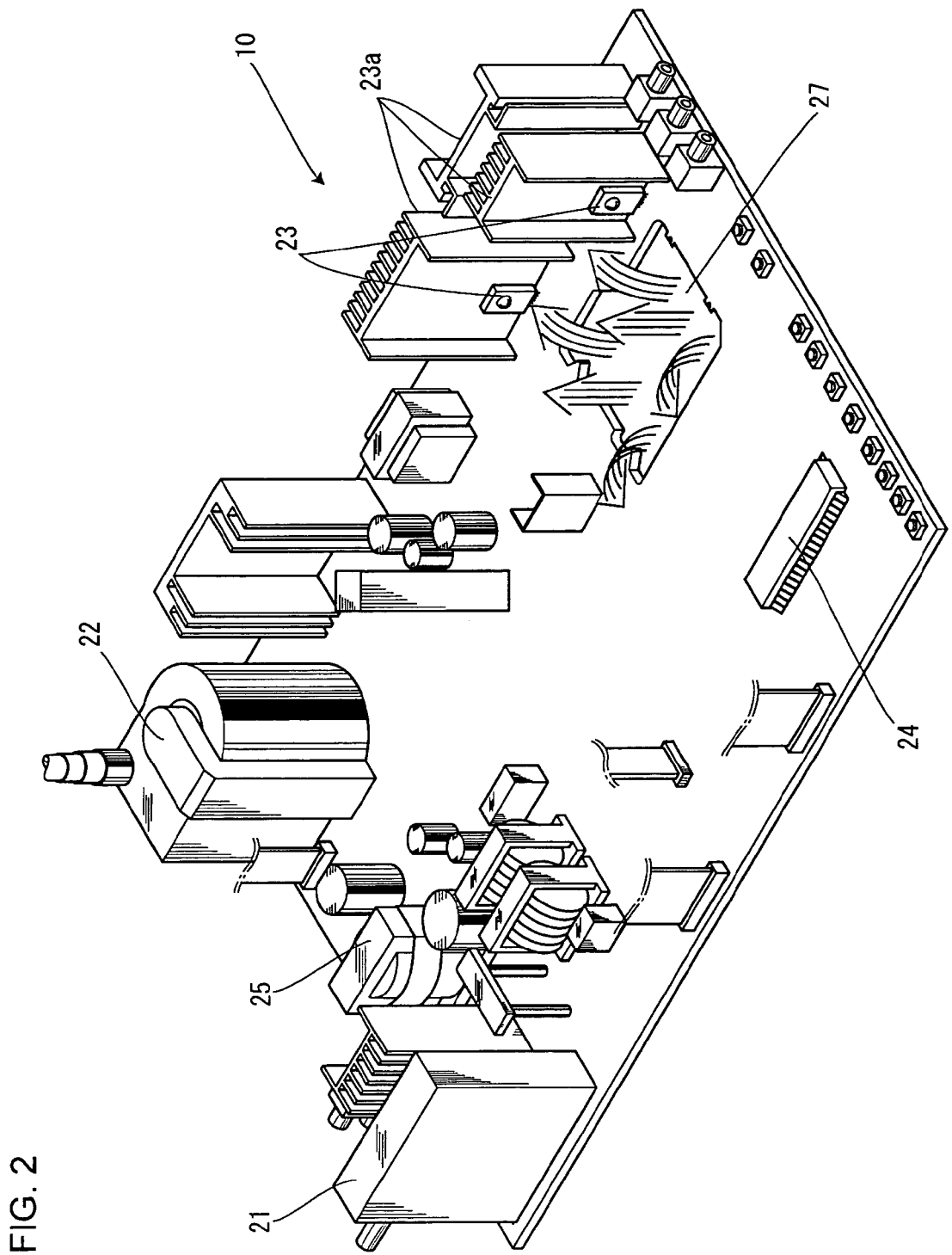
FIG. 2 is a perspective view of the printed circuit board with an improved heat dissipation efficiency according to the embodiment 1.
Figure 3:
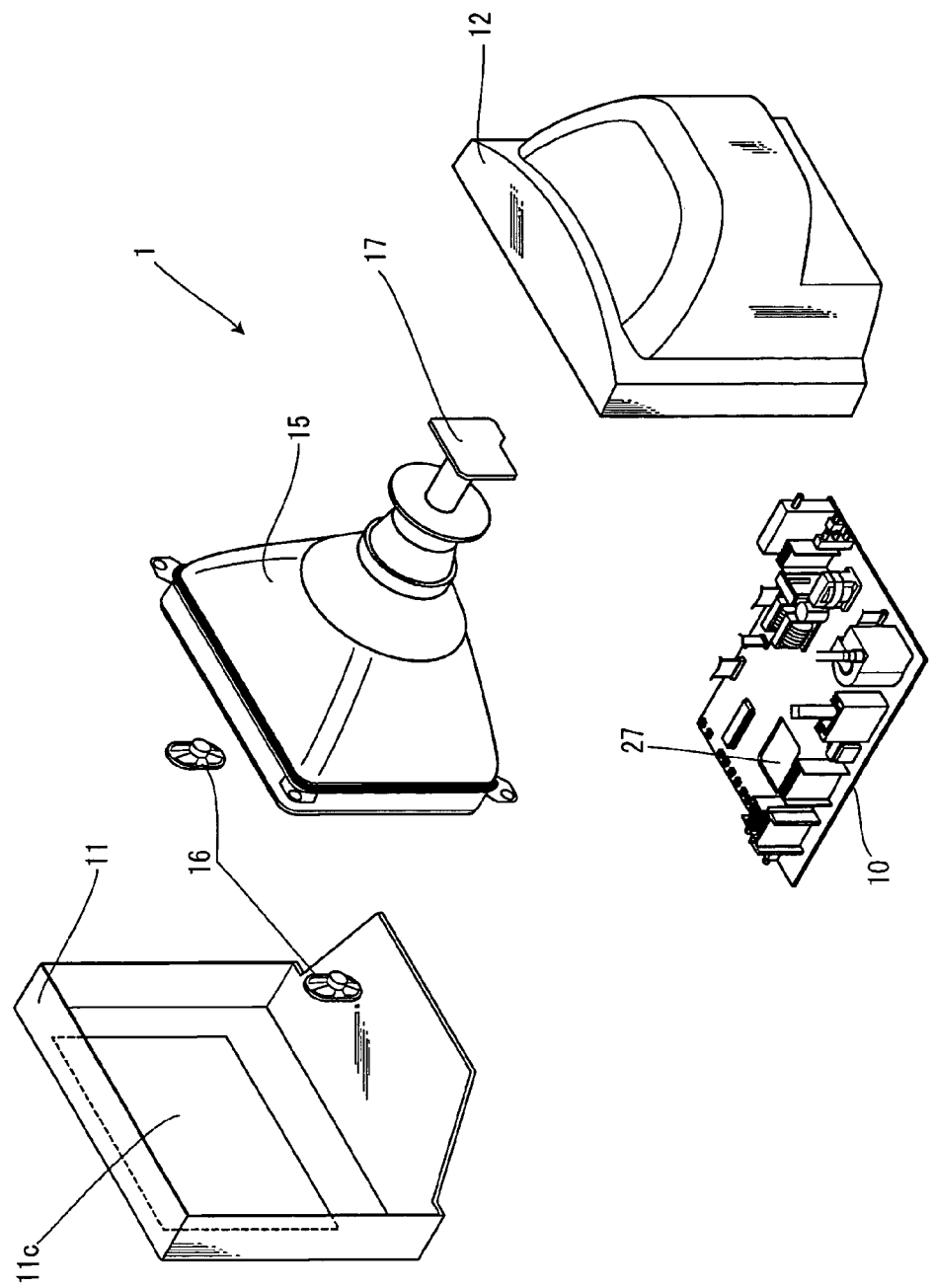
FIG. 3 is a schematic exploded perspective view of a CRT display device having the printed circuit board with an improved heat dissipation efficiency according to the embodiment 1.
Figure 4:
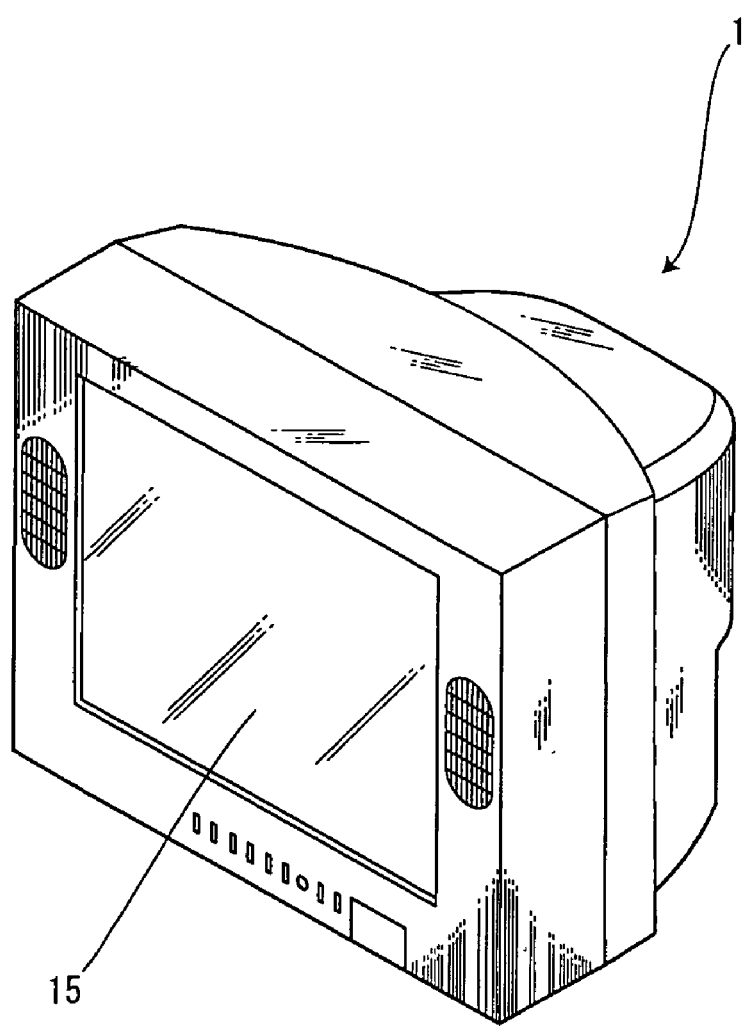
FIG. 4 is a perspective view of the CRT display device having the printed circuit board with an improved heat dissipation efficiency according to the embodiment 1.

FIG. 1 is a plan view of a printed circuit board with an improved heat dissipation efficiency according to an embodiment 1. FIG. 2 is a perspective view of the printed circuit board with a CRT board, which is a composite-molded board, removed. FIG. 3 is a schematic exploded perspective view of a CRT display device having the printed circuit board with an improved heat dissipation efficiency according to this embodiment. FIG. 4 is a perspective view of the CRT display device.

As shown in FIG. 3, a CRT display device 1 having a printed circuit board with an improved heat dissipation efficiency according to this embodiment (referred to simply as a CRT display device 1 hereinafter) comprises a CRT display tube 15, a main printed circuit board 10, a speaker 16 and the like, which are housed in a housing constituted by a front cabinet 11 and a rear cabinet 12. The front cabinet 11 has a window 11c, and the CRT display tube 15 is attached to the front cabinet 11 with a video display area thereof exposed to the outside through the window 11c. The main printed circuit board 10 is responsible for video and audio signal processing and is attached to the bottom of the front cabinet 11, and speakers 16 are attached to the opposite sides of the front cabinet 11 in consideration of the acoustic effect. In addition, a CRT board 17 having a circuit that amplifies RBG signals from the main printed circuit board 10 for output is connected to the CRT display tube 15.

As shown in FIG. 1, the main printed circuit board 10 and the CRT board 17 are composite-molded. Thus, in a step common to the main printed circuit board 10 and the CRT board 17, such as mounting and soldering of electric or electronic components onto the boards, the boards are not separated and are treated as one board, thereby reducing the number of steps and the cost. After the step common to the main printed circuit board 10 and the CRT board 17 is finished, the CRT board 17 is separated off the main printed circuit board 10 along successive cuts 17a formed in the main printed circuit board 10, and then, the CRT board 17 is used as a separate board (connected to the CRT display tube 15).

As shown in FIGS. 1 and 2, electric or electronic components, such as a tuner 21, a flyback transformer 22, a microcomputer 24, a power transformer 25 and a control IC, are mounted on the main printed circuit board 10. A heat-generating electronic component 23, such as a power transistor and a control IC, has a heat dissipation plate 23a, which enhances the heat dissipation efficiency of the heat-generating electronic component 23. Here, these drawings are simplified ones, and a wider variety of electric or electronic components are actually mounted on the main printed circuit board 10. As shown in these drawings, the CRT board 17, which is a composite-molded board, is formed near or immediately below the heat-generating electronic component 23 or the heat dissipation plate 23a. Accordingly, when the CRT board 17 is separated off the main printed circuit board 10, a ventilating hole 27 is formed in the main printed circuit board 10 near or immediately below the heat-generating electronic component 23 or the heat dissipation plate 23a.

When the electronic component 23 generates heat, the air around the component expands, decreases in density and thus ascends, and the surrounding air at a lower temperature flows into the space below the ascending air. As shown in FIG. 2, in the CRT display device 1 according to this embodiment, since the relatively large ventilating hole 27 is formed near the heat-generating electronic component 23 by removing the CRT board 17, the air at a lower temperature flows in also from below the board (the main printed circuit board 10) (in other words, a ventilating path from below the board is formed), and thus, the heat dissipation efficiency of the heat-generating component 23 is further improved. In addition, since the main printed circuit board 10 and the CRT board 17 are composite-molded, the production cost is reduced. And since the ventilating hole 27 is formed by separating the CRT board 17 off the main printed circuit board 10, a costly specially-designed mold or the like for forming the ventilating hole 27 and the process step of forming the ventilating hole 27 are not needed, so that the CRT display device having the printed circuit board with the heat dissipation efficiency of a heat-generating component improved can be produced at a low cost.

While this embodiment has been described taking the CRT display device as an example, the present invention is not limited thereto and can be applied to various kinds of electric apparatus having a printed circuit board on which a heat-generating electronic or electric component or device is mounted. For example, the electric apparatus may be an AV apparatus, a home heating appliance, and a heating and cooling appliance. The AV apparatus may be a television set, a VTR, a DVD player/recorder, an HDD player/recorder, a radio, a record player, a cassette deck, a home theater system, an audio component system, an AV amplifier, an MD recorder/player, a laser disc player, for example. The home heating appliance may be a microwave oven, an oven, a toaster, an IH cooker, an electric iron, for example. The heating and cooling appliance may be an air conditioner, a fan heater, an electric blanket, an electric carpet, and an electric fan, for example. Furthermore, the electric apparatus according to the present invention may be a refrigerator, a washing machine, a quilt dryer, a clothes dryer, a dehumidification machine, a humidifier, a Washlet toilet seat, a ventilating system, a personal computer, a cellular phone, a telephone, a clock, a digital camera, a video camera, a cleaner, a game machine, a projector, for example. In addition, since this embodiment has been described taking the CRT display device as an example, the composite-molded board formed at the site for the ventilating hole is the CRT board. However, the present invention is not limited thereto, and the composite-molded board may be any board depending on the electric appliance to which the present invention is applied, and the composite-molded board and the main board may be used without being incorporated in the same electric apparatus.

Embodiment 2

Figure 5:
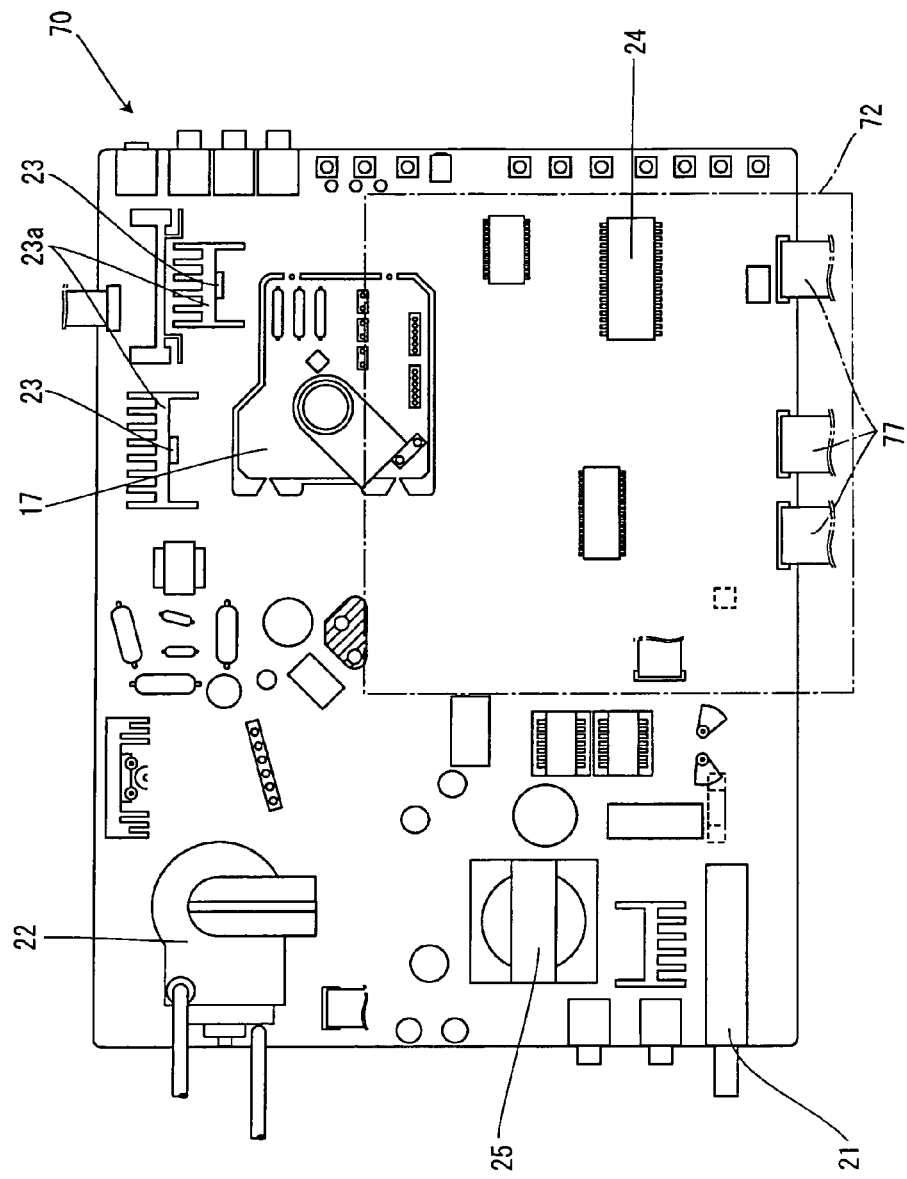
FIG. 5 is a plan view of a printed circuit board with an improved heat dissipation efficiency according to an embodiment 2.
Figure 6:
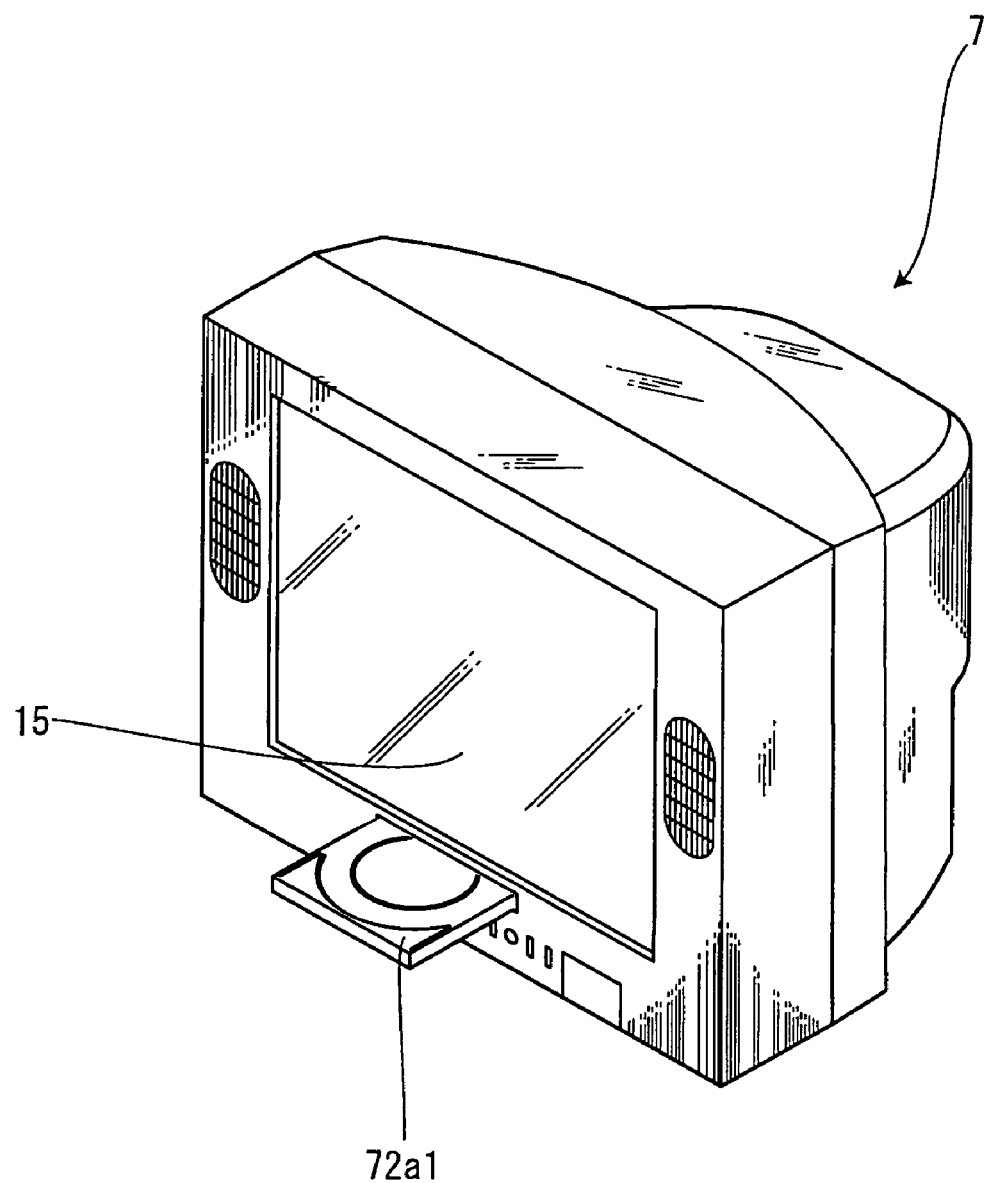
FIG. 6 is a perspective view of a video display device incorporating a recording/reproducing device according to the embodiment 2.
Figure 7:
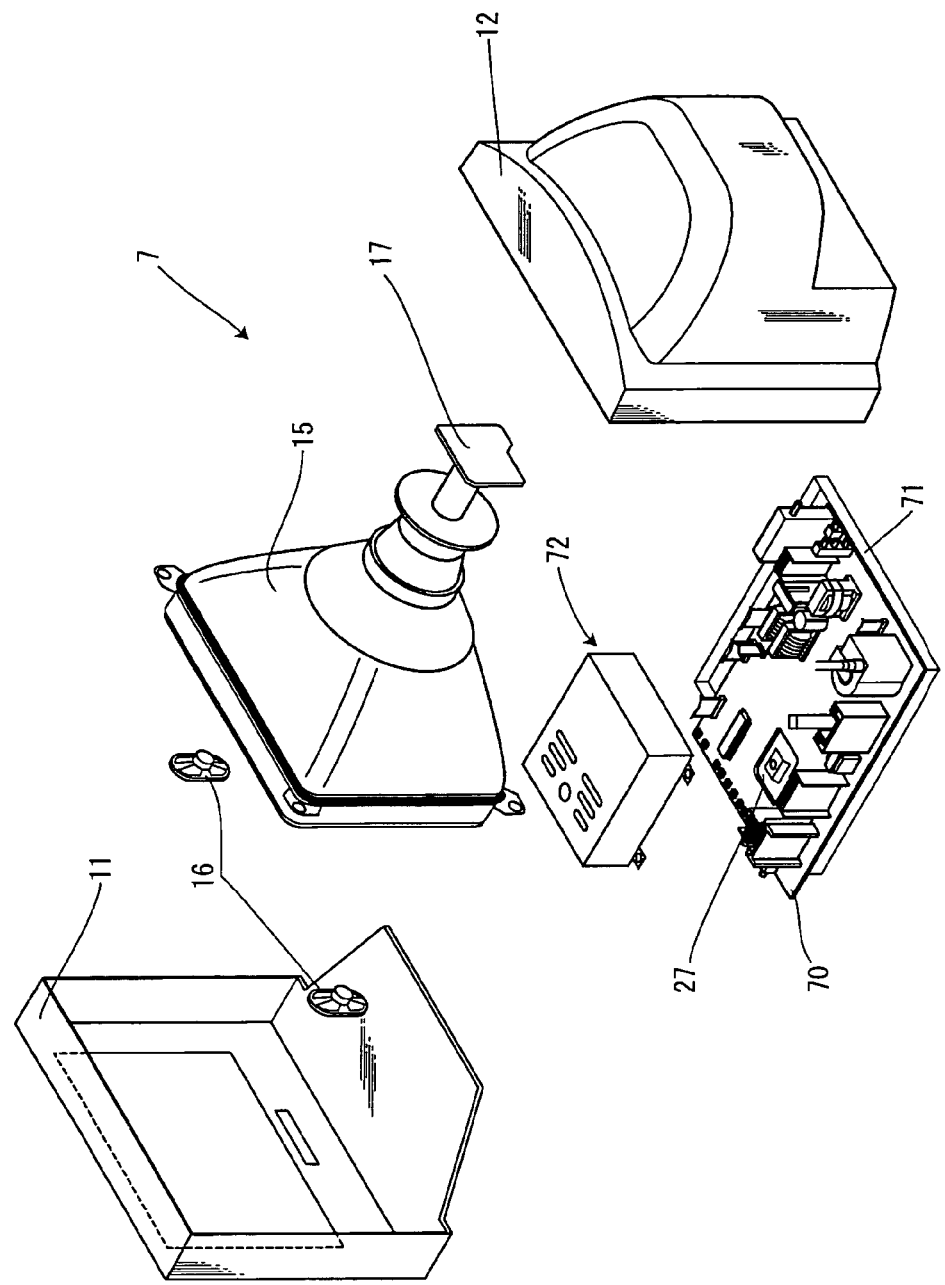
FIG. 7 is a schematic exploded perspective view of the video display device incorporating a recording/reproducing device according to the embodiment 2.
Figure 9:
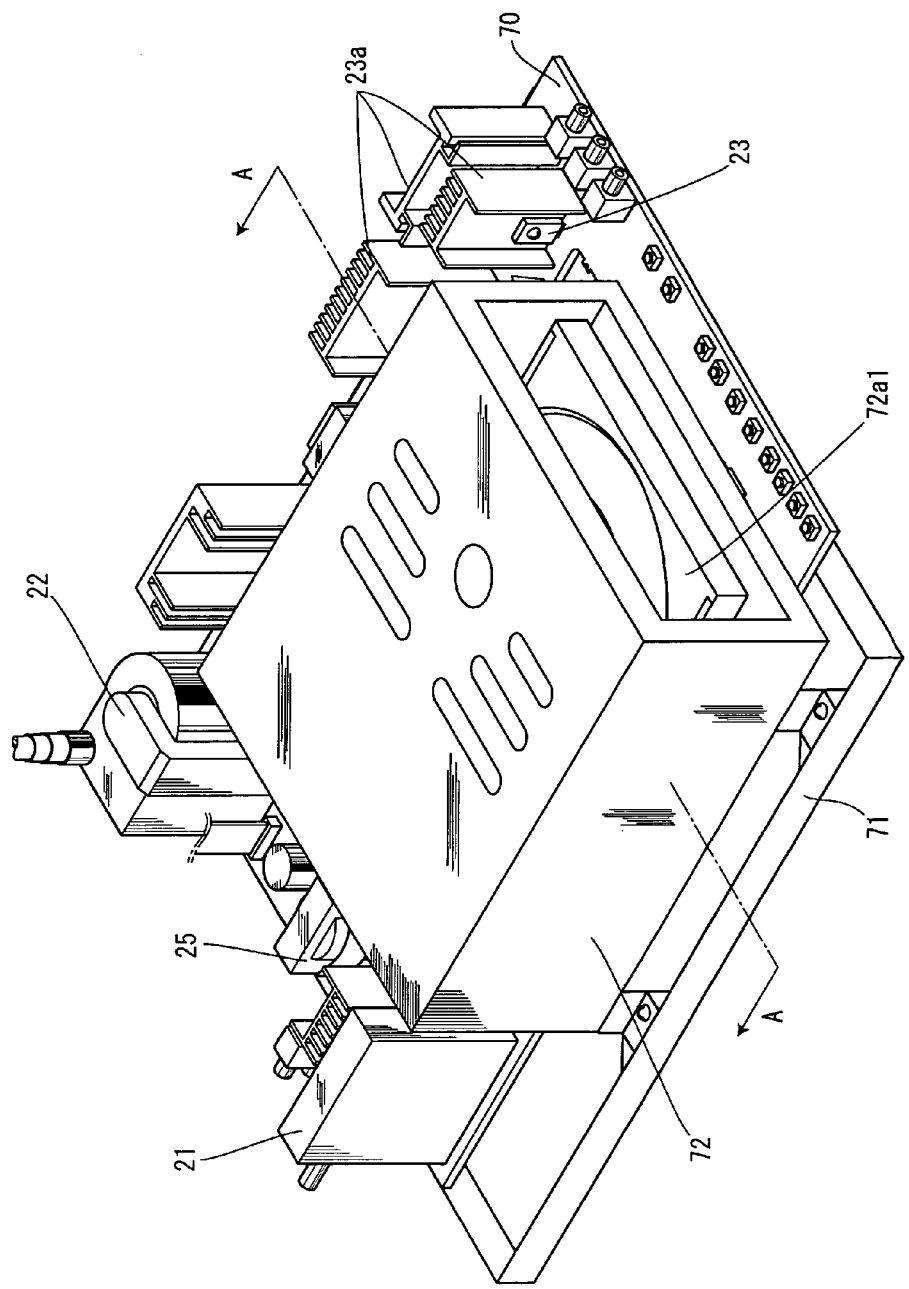
FIG. 9 is a perspective view of the printed circuit board and a DVD recording/reproducing unit attached to the chassis.
Figure 10:
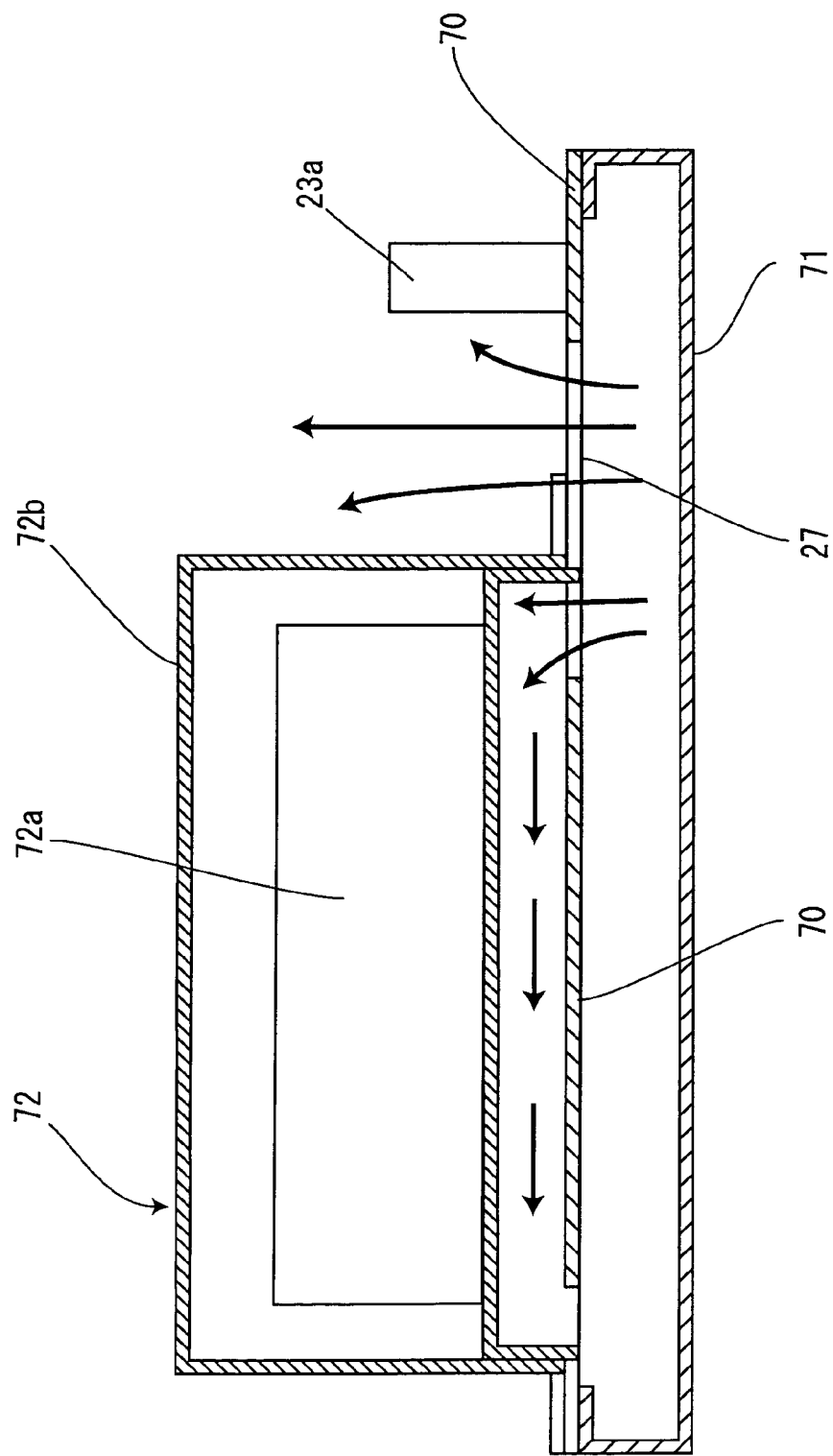
FIG. 10 is a cross-sectional view taken along the line A-A in FIG. 9.

FIG. 5 is a plan view of a printed circuit board with an improved heat dissipation efficiency according to an embodiment 2. FIG. 6 is a perspective view of a video display device incorporating a recording/reproducing device. FIG. 7 is a schematic exploded perspective view of the video display device incorporating the printed circuit board with an improved heat dissipation efficiency according to this embodiment. FIG. 9 is a perspective view of the printed circuit board with a CRT board, which is a composite-molded board, removed and a DVD recording/reproducing unit that are mounted on a chassis. FIG. 10 is a cross-sectional view taken along the line A-A in FIG. 9. The same parts as in the embodiment 1 are denoted by the same reference numerals and will not be further described.

Figure 8:
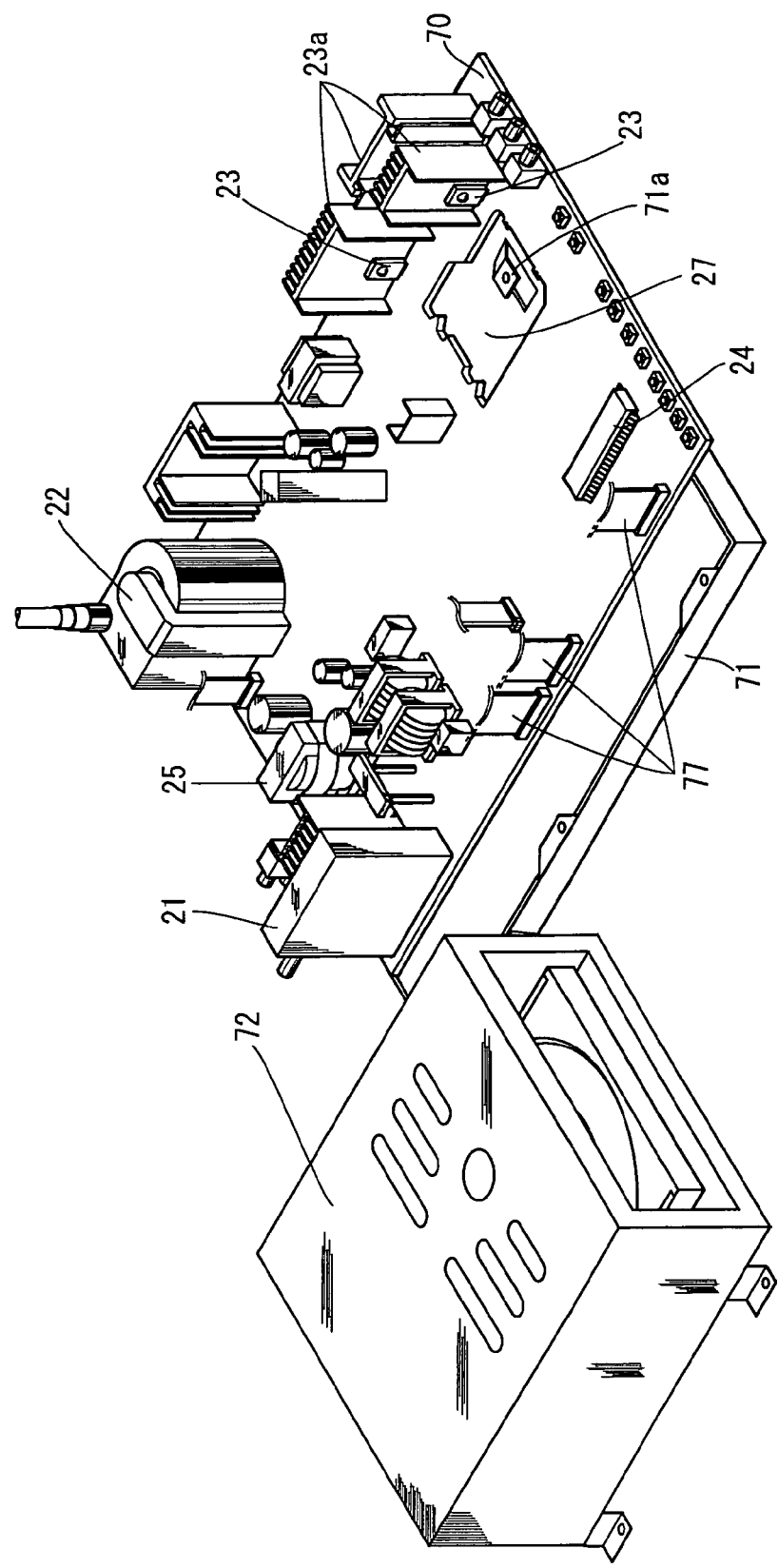
FIG. 8 is a perspective view of the printed circuit board attached to a chassis.

A video display device 7 incorporating a recording/reproducing device having a printed circuit board with an improved heat dissipation efficiency according to this embodiment (referred to simply as a composite machine 7, hereinafter) comprises a CRT display tube 15, a main printed circuit board 70, a speaker 16 and the like, which are housed in a housing constituted by a front cabinet 11 and a rear cabinet 12, and a CRT board 17 is connected to the CRT display tube 15. The main printed circuit board 70 is held by a chassis 71 and attached to the front cabinet 11. In addition, as shown in FIGS. 8 and 9, a DVD recording/reproducing unit 72, which is a recording/reproducing device, is attached to the chassis 71 in such a manner that the DVD recording/reproducing unit 72 is located above the main printed circuit board 70 (FIG. 8 is a perspective view of the DVD recording/reproducing unit 72 yet to be attached to the chassis 71). Once the chassis 71 is attached to the front face of the front cabinet 11 at the bottom thereof, as shown in FIG. 6, a disk tray 72a1 of a disk device 72a can be ejected and retracted at the front face of the composite machine 7, and an optical disk medium can be inserted to or removed from the composite machine 7.

As shown in FIG. 10, the DVD recording/reproducing unit 72 comprises the disk device 72a for reading and/or writing signals from/to an optical disk medium housed in a shielding box 72b for noise shielding. In addition, as shown in FIGS. 8 and 9, the DVD recording/reproducing unit 72 is attached to the chassis 71 in such a manner that it is located above the main printed circuit board 70, and the disk device 72a and the main printed circuit board 70 are electrically connected to each other via a flat cable 77 or the like, thereby enabling electric power supply and input and output of video, audio and control signals.

As shown in FIG. 5, the main printed circuit board 70 and the CRT board 17 are composite-molded, and the CRT board 17 is formed so that a portion of the CRT board 17 is located immediately below the DVD recording/reproducing unit 72 that generates much heat and the CRT board 17 is located near a heat-generating electronic component 23 or a heat dissipation plate 23a. Consequently, when the CRT board 17 is separated off the main printed circuit board 70, a ventilating hole 27 is formed in the main printed circuit board 70 immediately below the DVD recording/reproducing unit 72 and near or immediately below the heat-generating electronic component 23 or the heat dissipation plate 23a.

As shown in FIG. 10, in the composite machine 7 according to this embodiment, the ventilating hole 27 is formed to provide a ventilating path from below the main printed circuit board 70, and thus, air at a lower temperature flows into spaces below the DVD recording/reproducing unit 72 and between the DVD recording/reproducing unit 72 and the heat-generating electronic component 23. Accordingly, the problem that the DVD recording/reproducing unit 72 and the heat-generating electronic component 23 mutually accelerate the rise of temperature, which arises if the ventilating hole 27 is not formed, can be alleviated or avoided. In particular, since the recordable disk device that is now in increasing demand generates more heat than the reproduction-only one, and the amount of heat generated by the disk device is increasing with the current trend toward higher recording speeds and, therefore, higher powers, the present invention can be suitably applied to such a disk device.

Furthermore, since the composite-molded board (the CRT board 17) is formed immediately below the DVD recording/reproducing unit 72, even if the DVD recording/reproducing unit 72 is located above the main printed circuit board 70 on the chassis 71 as shown in FIGS. 8 and 9, the DVD recording/reproducing unit 72 can be fixed to a lug 71a formed on the chassis 71 via the ventilating hole 27 (that is, the DVD recording/reproducing unit 72 can be directly connected to the chassis 71), and thus, the strength and design flexibility of the device are improved. In addition, forming the lug 71a on the chassis 71 results in a hole in the chassis 71, and the hole serves as a ventilating hole and provides a ventilating path from below the chassis 71 to above the main printed circuit board 70. Thus, the heat dissipation efficiency of the DVD recording/reproducing unit 72 and the heat-generating electronic component 23 can be further improved.

This embodiment has been described taking the CRT display device incorporating a DVD recording/reproducing device as an example of the video display device incorporating a recording/reproducing device. However, the present invention is not limited thereto, and the recording/reproducing device may be an HDD, a VCR or the like, and the display device may be an LCD or the like.

What is claimed is:

1. A printed circuit board with an improved heat dissipation efficiency, the printed circuit board comprising:
   a heat-generating electronic component mounted on the printed circuit board; and
   a composite-molded board formed in the printed circuit board at an area close to or immediately below said heat-generating electric component, wherein
   the composite-molded board is to be separated off the printed circuit board for use, and
   a ventilating hole is formed in the printed circuit board when the composite-molded board is separated off the printed circuit board.

2. An electric apparatus having a printed circuit board with an improved heat dissipation efficiency, wherein the printed circuit board is the printed circuit board with an improved heat dissipation efficiency as set forth in claim 1.

3. A CRT display device having a printed circuit board with an improved heat dissipation efficiency, wherein the printed circuit board is the printed circuit board with an improved heat dissipation efficiency as set forth in claim 1, and said composite-molded board is a CRT board.

* * * * *